(12) United States Patent
Lee et al.

(10) Patent No.: US 9,979,331 B2
(45) Date of Patent: May 22, 2018

(54) METHOD FOR CONTROLLING A MOTOR

(71) Applicants: Hyundai Motor Company, Seoul (KR); KIA MOTORS CORP., Seoul (KR)

(72) Inventors: Hak Sung Lee, Gunpo-si (KR); Sang Lok Song, Hwaseong-si (KR); Gyeong Cheol Kim, Hwaseong-si (KR)

(73) Assignees: HYUNDAI MOTOR COMPANY, Seoul (KR); KIA MOTORS CORPORATION, Seoul (KR)

(*) Notice: Subject to any disclaimer, the term of this patent is extended or adjusted under 35 U.S.C. 154(b) by 0 days. days.

(21) Appl. No.: 14/850,329

(22) Filed: Sep. 10, 2015

(65) Prior Publication Data

US 2016/0373048 A1 Dec. 22, 2016

(30) Foreign Application Priority Data

Jun. 17, 2015 (KR) .................. 10-2015-0086111

(51) Int. Cl.

| H02K 29/08 | (2006.01) |
|---|---|
| H02P 6/16 | (2016.01) |
| G01R 33/07 | (2006.01) |
| G01D 5/14 | (2006.01) |
| G01D 5/244 | (2006.01) |

(Continued)

(52) U.S. Cl.
CPC .............. *H02P 6/16* (2013.01); *G01D 5/145* (2013.01); *G01D 5/24476* (2013.01); *G01R 33/07* (2013.01); *H02P 29/0241* (2016.02); *H02P 29/032* (2016.02)

(58) Field of Classification Search
USPC .............. 318/400.38, 603, 400.13, 638; 324/207.2, 207.12, 117 H, 76.16, 225
See application file for complete search history.

(56) References Cited

U.S. PATENT DOCUMENTS

| 2003/0155912 A1* | 8/2003 | Motz ...................... G01R 33/07 324/225 |
| 2005/0076867 A1* | 4/2005 | Tani ...................... F01L 1/022 123/90.17 |

(Continued)

FOREIGN PATENT DOCUMENTS

| JP | 2007-151266 A | 6/2007 |
| JP | 2007151266 A * | 6/2007 |

(Continued)

OTHER PUBLICATIONS

Korean Office Action issued in Korean Application No. 10-2015-0086111, dated Jul. 6, 2016.

(Continued)

*Primary Examiner* — Jorge L Carrasquillo
(74) *Attorney, Agent, or Firm* — McDermott Will & Emery LLP

(57) ABSTRACT

A method for controlling a motor includes detecting output signals output from three phases of a hall sensor, determining a failure of the hall sensor depending on the output signals, diagnosing which of the three phases of the hall sensor is out of order based on the output signals if it is determined that the hall sensor detections deviate from a predicted order, and outputting a virtual signal for the phase which is determined as a failure among the three phases of the hall sensor to a motor controller.

8 Claims, 14 Drawing Sheets

(51) Int. Cl.
*H02P 29/032* (2016.01)
*H02P 29/024* (2016.01)

(56) References Cited

U.S. PATENT DOCUMENTS

| | | | |
|---|---|---|---|
| 2005/0152489 A1* | 7/2005 | Morita, Jr. | H02P 6/16 377/6 |
| 2011/0018534 A1* | 1/2011 | Peukert | G01R 33/07 324/251 |
| 2012/0152647 A1* | 6/2012 | Uryu | B62D 5/0487 180/446 |
| 2015/0137718 A1* | 5/2015 | Liu | G01R 23/00 318/400.03 |

FOREIGN PATENT DOCUMENTS

| | | | |
|---|---|---|---|
| JP | 2012-135097 A | | 7/2012 |
| JP | 2013-179742 A | | 9/2013 |
| JP | 2013179742 A | * | 9/2013 |
| JP | 2015-010904 A | | 1/2015 |
| KR | 10-1038668 B1 | | 6/2011 |
| KR | 10-2013-0065411 A | | 6/2013 |
| KR | 10-2013-0072659 A | | 7/2013 |
| KR | 10-2013-0098809 A | | 9/2013 |
| KR | 20130098809 A | * | 9/2013 |

OTHER PUBLICATIONS

Korean Notice of Allowance issued in Korean Application No. 10-2015-0086111 dated Dec. 2, 2016.

* cited by examiner

| phase | S1 | S2 | S3 | S3 | S4 | S5 | S6 |
|---|---|---|---|---|---|---|---|
| U | 1 | 1 | 1 | 1 | 0 | 0 | 0 |
| V | 0 | 0 | 1 | 1 | 1 | 1 | 0 |
| W | 1 | 0 | 0 | 1 | 1 | 1 | 1 |

| phase | S1 | S2 | S3 | S4 | S5 | S6 |
|---|---|---|---|---|---|---|
| U | 1 | 1 | 1 | 1 | 1 | 1 |
| V | 0 | 0 | 1 | 1 | 1 | 0 |
| W | 1 | 0 | 0 | 0 | 1 | 1 |

| phase | S1 | S1 | S2 | S3 | S4 | S5 | S6 |
|---|---|---|---|---|---|---|---|
| U | 1 | 1 | 1 | 1 | 0 | 0 | 0 |
| V | 0 | 1 | 1 | 1 | 1 | 1 | 1 |
| W | 1 | 1 | 0 | 0 | 0 | 1 | 1 |

| phase | S1 | S2 | S3 | S4 | S5 | S6 |
|---|---|---|---|---|---|---|
| U | 1 | 1 | 1 | 0 | 0 | 0 |
| V | 0 | 0 | 1 | 1 | 1 | 0 |
| W | 1 | 1 | 1 | 1 | 1 | 1 |

| phase | S1 | S2 | S3 | S4 | S5 | S5 | S6 |
|---|---|---|---|---|---|---|---|
| U | 1 | 1 | 1 | 0 | 0 | 1 | 1 |
| V | 0 | 0 | 1 | 1 | 1 | 1 | 0 |
| W | 1 | 0 | 0 | 0 | 1 | 1 | 1 |

| phase | S1 | S2 | S3 | S4 | S5 | S6 |
|-------|----|----|----|----|----|----|
| U | 1 | 1 | 1 | 0 | 0 | 0 |
| V | 1 | 1 | 1 | 1 | 1 | 1 |
| W | 1 | 0 | 0 | 0 | 1 | 1 |

| phase | S1 | S2 | S3 | S4 | S5 | S6 | S6 |
|-------|----|----|----|----|----|----|----|
| U | 1 | 1 | 1 | 0 | 0 | 0 | 0 |
| V | 0 | 0 | 1 | 1 | 1 | 0 | 0 |
| W | 1 | 0 | 0 | 0 | 1 | 1 | 0 |

| phase | S1 | S2 | S3 | S4 | S5 | S6 |
|---|---|---|---|---|---|---|
| U | 0 | 0 | 0 | 0 | 0 | 0 |
| V | 0 | 0 | 1 | 1 | 1 | 0 |
| W | 1 | 0 | 0 | 0 | 1 | 1 |

| phase | S1 | S2 | S3 | S4 | S4 | S5 | S6 |
|---|---|---|---|---|---|---|---|
| U | 1 | 1 | 1 | 0 | 0 | 0 | 0 |
| V | 0 | 0 | 1 | 1 | 0 | 0 | 0 |
| W | 1 | 0 | 0 | 0 | 0 | 1 | 1 |

| phase | S1 | S2 | S3 | S4 | S5 | S6 |
|-------|----|----|----|----|----|----|
| U | 1 | 1 | 1 | 0 | 0 | 0 |
| V | 0 | 0 | 1 | 1 | 1 | 0 |
| W | 0 | 0 | 0 | 0 | 0 | 0 |

| phase | S1 | S2 | S2 | S3 | S4 | S5 | S6 |
|---|---|---|---|---|---|---|---|
| U | 1 | 1 | 0 | 0 | 0 | 0 | 0 |
| V | 0 | 0 | 0 | 1 | 1 | 1 | 0 |
| W | 1 | 0 | 0 | 0 | 0 | 1 | 1 |

| phase | S1 | S2 | S3 | S4 | S5 | S6 |
|---|---|---|---|---|---|---|
| U | 1 | 1 | 1 | 0 | 0 | 0 |
| V | 0 | 0 | 0 | 0 | 0 | 0 |
| W | 1 | 0 | 0 | 0 | 1 | 1 |

METHOD FOR CONTROLLING A MOTOR

CROSS REFERENCE TO RELATED APPLICATION

The present application claims priority to Korean Patent Application No. 10-2015-0086111, filed Jun. 17, 2015 with the Korean Intellectual Property Office, which is incorporated herein by reference in its entirety.

TECHNICAL FIELD

The present disclosure relates a method for controlling a motor capable of determining a failure of a hall sensor of the motor and outputting a virtual signal to the broken hall sensor to continuously drive the motor.

BACKGROUND

Generally, an electric oil pump (EOP) includes a brushless DC motor (BLDC motor). The brushless motor keeps the characteristics of a three-phase DC motor while removing a brush serving as a commutator in a general three-phase DC motor, and further includes a rotor formed of a permanent magnet and a stator around which three coils (U-phase, V-phase, and W-phase coils) are wound.

The brushless motor supplies a three-phase current to each of the U-phase, V-phase, and W-phase coils wound around the stator and allows each of the U-phase, V-phase, and W-phase coils to generate a magnetic field depending on the supplied three-phase current to rotate the rotor, which comprises the permanent magnet.

To accurately control a rotating speed of the rotor of the brushless motor, there is a need to accurately estimate a position of the rotor. A hall sensor is generally used for this purpose. The hall sensor is used to measure a rotating position and direction of the motor by sensing a hall effect. In detail, the hall sensor may detect a relative position of the rotor to the stator based on the magnetic field generated by the permanent magnet of the rotor.

However, when the hall sensor output deviates from a predicted order, the position of the rotor may not be accurately detected. For example, a waveform is normally generated in a half period of one period of an output signal from the hall sensor which is in a failure condition. Further, a waveform corresponding to a mismatched phase is generated in the remaining half period, such that a driving voltage formed from an incorrect output signal is applied to the motor. Following this, a current conducted to the motor is increased or noise and vibration produced by the motor is increased. Accordingly, the rotation of the motor is likely to become unstable.

When the brushless motor is abnormally operated due to the failure of the hall sensor, the electric oil pump may not smoothly produce an oil pressure. Therefore, the related art performs a method for controlling a motor which leaves the motor in an inertial rotating state when it is detected that the hall sensor output deviates from a predicted order, then determines which of the three phases of the hall sensor is out of order based on the output signal of the hall sensor depending on the inertial rotation, and outputs a virtual waveform depending on the determined result.

However, when oil temperature in the electric oil pump is low or an RPM is low, the motor may not smoothly allow inertial rotation due to pump resistance, and stoppage may occur. It may then be difficult to determine which of the three phases of the hall sensor are out of order, and the control of the virtual waveform may not be performed.

The matters described as the related art have been provided only for assisting in the understanding for the background of the present disclosure and should not be considered as corresponding to the related art known to those skilled in the art.

SUMMARY OF THE DISCLOSURE

An object of the present disclosure is to provide a method for controlling a motor capable of diagnosing which phase is out of order based on an output signal from a hall sensor always detected when it is determined that the hall sensor is out of order by always detecting the output signal from the hall sensor and outputting a virtual waveform depending on the diagnosed results to continuously drive the motor.

According to an exemplary embodiment of the present disclosure, a method for controlling a motor is provided, including: detecting output signals from three phases of a hall sensor; determining a failure of the hall sensor depending on the output signals; diagnosing which of the three phases of the hall sensor is out of order based on the output signals if it is determined that the hall sensor detections deviate from a predetermined order; and outputting a virtual signal for the phase which is determined as a failure among the three phases of the hall sensor to a motor controller.

When the failure signal which is the output signal corresponding to the failure from the hall sensor is received beyond predetermined frequency or the failure signal is periodically received for a predetermined time, it may be determined that the hall sensor detections deviate from a predetermined order.

The diagnosing may include: measuring a difference between the time at the start of generating the failure signal which is the output signal corresponding to the failure and the time at the start of generating the normal signal which is the output signal just before the failure signal is received; and diagnosing which of the three phases of the hall sensor is out of order depending on the difference.

During diagnosing which of the three phases of the hall sensor is out of order depending on the difference, when the normal signals are the output signals that the U phase and the V phase of the three phases of the hall sensor are 1 and the failure signals are the output signals that the three phases all are 1, if the difference is beyond the preset time, the U phase may be diagnosed as the failure and if the difference is less than the preset time, the W phase may be diagnosed as the failure.

During diagnosing which of the three phases of the hall sensor is out of order depending on the difference, when the normal signals are the output signals that the U phase and the W phase of the three phases of the hall sensor are 1 and the failure signals are the output signals that the three phases all of the hall sensor are 1, if the difference is beyond the preset time, the W phase may be diagnosed as the failure and if the difference is less than the preset time, the V phase may be diagnosed as the failure.

During diagnosing which of the three phases of the hall sensor is out of order depending on the difference, when the normal signals are the output signals that the V phase and the W phase of the three phases of the hall sensor are 1 and the failure signals are the output signals that the three phases all of the hall sensor are 1, if the difference is beyond the preset time, the V phase may be diagnosed as the failure and if the difference is less than the preset time, the U phase may be diagnosed as the failure.

During diagnosing which of the three phases of the hall sensor is out of order depending on the difference, when the normal signals are the output signals that only the W phase of the three phases of the hall sensor are 1 and the failure signals are the output signals that the three phases all are 0, if the difference is beyond the preset time, the U phase may be diagnosed as the failure and if the difference is less than the preset time, the W phase may be diagnosed as the failure.

During the diagnosing which of the three phases of the hall sensor is out of order depending on the difference, when the normal signal is the output signal that only the V phase of the three phases of the hall sensor is 1 and the failure signal is the output signal that the three phases all of the hall sensor are 0, if the difference is beyond the preset time, the W phase may be diagnosed as the failure and if the difference is less than the preset time, the V phase may be diagnosed as the failure.

During diagnosing which of the three phases of the hall sensor is out of order depending on the difference, when the normal signal is the output signal that only the U phase of the three phases of the hall sensor is 1 and the failure signal is the output signal that the three phases of the hall sensor all are 0, if the difference is beyond the preset time, the V phase may be diagnosed as the failure and if the difference is less than the preset time, the U phase may be diagnosed as the failure.

BRIEF DESCRIPTION OF THE DRAWINGS

The above and other objects, features and advantages of the present disclosure will be more clearly understood from the following detailed description taken in conjunction with the accompanying drawings, in which.

DETAILED DESCRIPTION

Hereinafter, a method for controlling a motor according to an exemplary embodiment of the present disclosure will be described with reference to the accompanying drawings.

Figure 1:
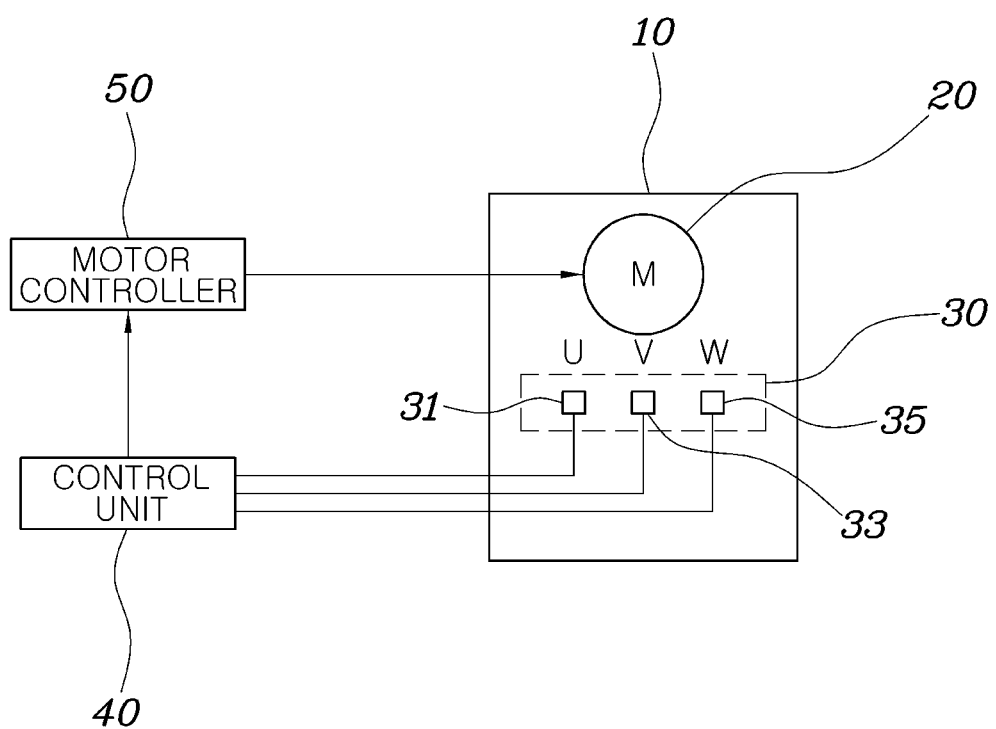
FIG. 1 is a diagram illustrating an apparatus of controlling a motor according to an exemplary embodiment of the present disclosure.
Figure 2:
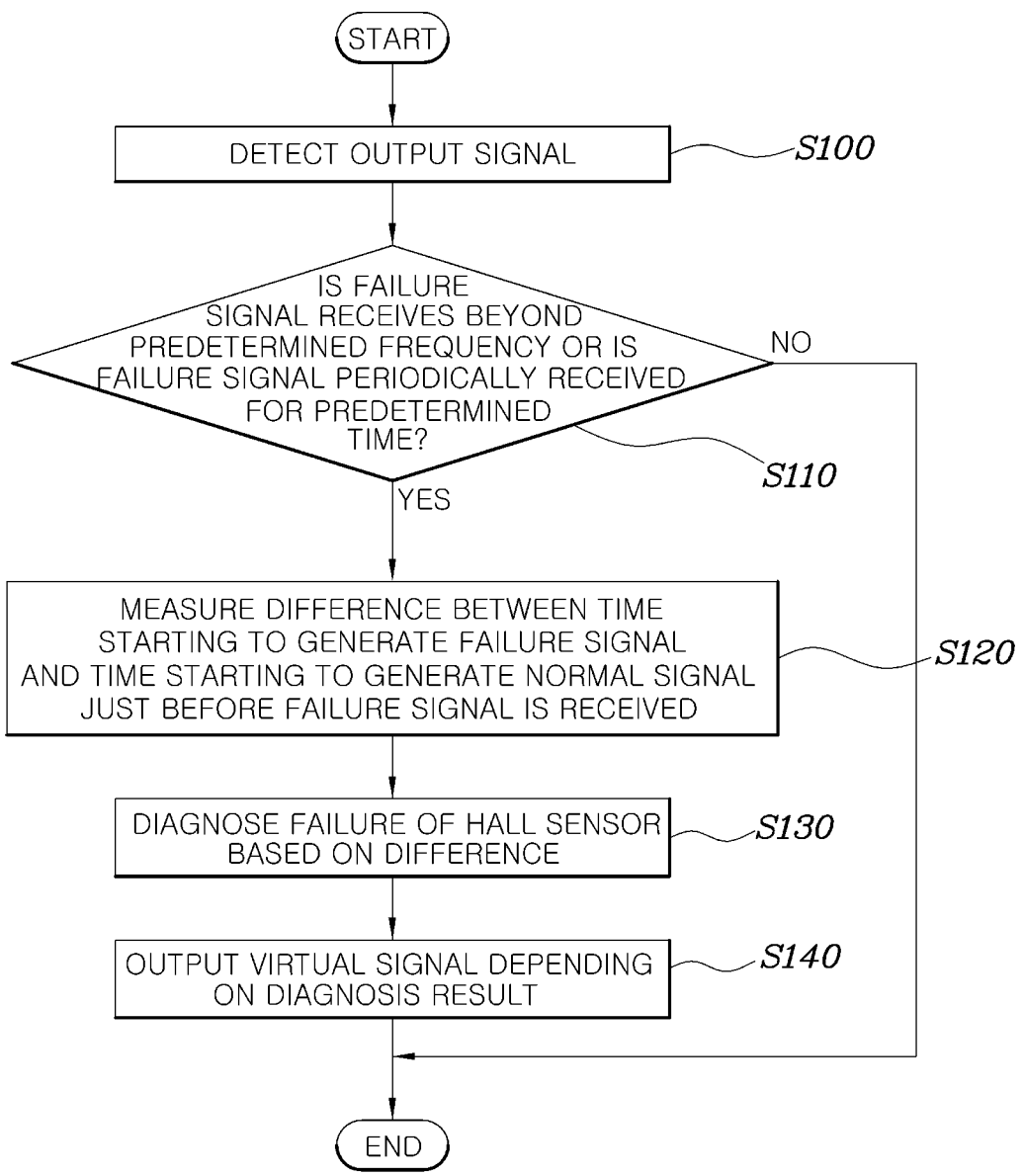
FIG. 2 is a flow chart illustrating a method for controlling a motor according to an exemplary embodiment of the present disclosure.

FIG. 1 is a diagram illustrating an apparatus of controlling a motor according to an exemplary embodiment of the present disclosure, FIG. 2 is a flow chart illustrating a method for controlling a motor according to an exemplary embodiment of the present disclosure, and FIGS. 3 to 8 are graphs and tables illustrating a method for diagnosing a failure according to an exemplary embodiment of the present disclosure. Referring to FIGS. 1 to 8, the method for controlling a motor may include always detecting output signals output from three phases 31, 33 and 35 from a hall sensor 30 to determine a failure of the hall sensor 30 depending on the output signals (S110), diagnosing which of the three phases 31, 33, and 35 of the hall sensor is out of order, or functions problematically, based on the output signals if it is determined that the hall sensor 30 detections deviate from a predicted order, or functions problematically, (S130), and outputting a virtual signal for the phase which is diagnosed as a failure among the three phases 31, 33 and 35 of the hall sensor to a motor controller 50 (S140).

Generally, when the hall sensor 30 detections deviate from a predicted order, the motor 20 starts an inertial rotation and the control unit 20 receives the output signal from the hall sensor 30 of the motor which is in the inertial rotation state to diagnose which of the three phases of the hall sensor 30 is out of order.

The existing control unit 20 starts to receive the output signal from the hall sensor 30 only when the failure of the hall sensor 30 is detected. That is, to diagnose which of the three phases 31, 33, and 35 of the hall sensor is out of order, it takes time to receive the output signal. However, as illustrated in FIG. 1, when the motor 20 is applied to the electric oil pump 10, the motor is in the inertial rotation state when the hall sensor 30 detections deviate from a predicted order. If oil temperature of the electric oil pump 10 is low or an RPM of the motor is low, the motor 20 may not continuously rotate due to the resistance of the electric oil pump 10 for the time taken to perform the diagnosis. Therefore, the specific failure diagnosis of the hall sensor 30 may not be performed and the electric oil pump 10 also may stop, and thus the vehicle may not be driven.

In addition, the control unit 40 according to the exemplary embodiment of the present disclosure detects PWM waveforms which are the output signals from the hall sensor 30 depending on the rotation of the motor 20. In particular, the control unit 40 may detect the output signals of the three phases 31, 33 and 35 from the hall sensor, even when the failure of the hall sensor 30 is not detected, to immediately diagnose which phase of the three phases 31, 33 and 35 of the hall sensor is out of order. If it is determined that the hall sensor 30 detections deviate from a predicted order, the hall sensor 30 may output a virtual signal to the motor controller 50 depending on the diagnosis results, thereby preventing the motor from stopping due to the resistance of the pump.

The hall sensor 30 in the normal state outputs a three-phase sine wave in which the PWM electrical angles are each formed to have a difference of 60°. When at least one of the three phases 31, 33 and 35 of the hall sensor is out of order, the control unit 40 does not receive the output signal having a normal sine wave from the broken phase of the hall sensor 30 but receives the PWM waveform of 0 or 1 at a time. Therefore, the control unit 40 receives the output signals that the three phases 31, 33 and 35 of the hall sensor all are 0 or 1, and in such a case, the control unit 40 may determine that the hall sensor 30 is in a failure condition.

In determining a condition from the output signals (S110), when the failure signal which is the output signal corresponding to the failure from the hall sensor 30 is received beyond a predetermined frequency, or the failure signal is periodically received for a predetermined time, it may be determined that the hall sensor 30 detections deviate from a predicted order.

That is, when the output signals all are detected as the failure signals of 0 or 1 while the output signals of the three phases 31, 33, and 35 of the hall sensor are detected, the control unit 40 may determine whether the failure signal is received beyond the predetermined frequency or is periodically received for a predetermined time, and determine whether the hall sensor 30 detections deviate from a predicted order. When the failure signal is received beyond a predetermined frequency or is periodically received for a predetermined time, the control unit 40 determines that the hall signal 30 detections deviate from a predicted order and diagnoses which phase of the three phases 31, 33, and 35 of the hall sensor gets is of order.

The diagnosing includes measuring a difference between the time at the start of generation of the failure signal, which is the output signal corresponding to the failure and the time at the start of generation of the normal signal, which is the output signal just before the failure signal is received (S120), and diagnosing which of the three phases 31, 33, and 35 of the hall sensor is out of order depending on the difference (S130).

If it is determined that the hall sensor 30 detections deviate from a predicted order, the control unit 40 diagnoses the broken phase of the hall sensor 30 using the output signals just before the failure signals that the three phases 31, 33, and 35 of the hall sensor all are 0 or 1. For example, when the U phase 31 outputs 1 as the output signal due to the failure, the normal signal output just before the failure signal of U phase: 1, V phase: 1, and W phase: 1 (hereinafter, 1, 1, 1) will be 1, 1, 0. Therefore, when the normal signal just before the failure signal is 1, 1, and 0, the failure of the U phase 31 of the three phases of the hall sensor is diagnosed. In addition, the case in which the V phase, the W phase, and at least two phases get out of order may be diagnosed by the foregoing diagnosis method.

Figures 3A, 3B:
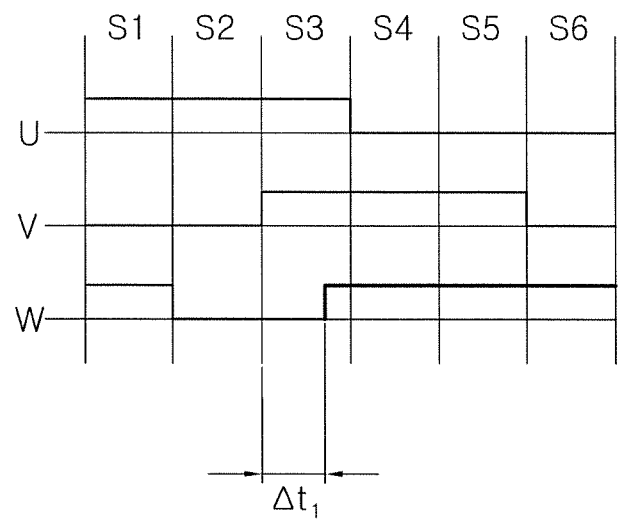
FIGS. 3A to 3D, 4A to 4D, 5A to 5D, 6A to 6D, 7A to 7D, and 8A to 8D are graphs and tables illustrating a method for diagnosing a failure according to an exemplary embodiment of the present disclosure.
Figures 3C, 3D:
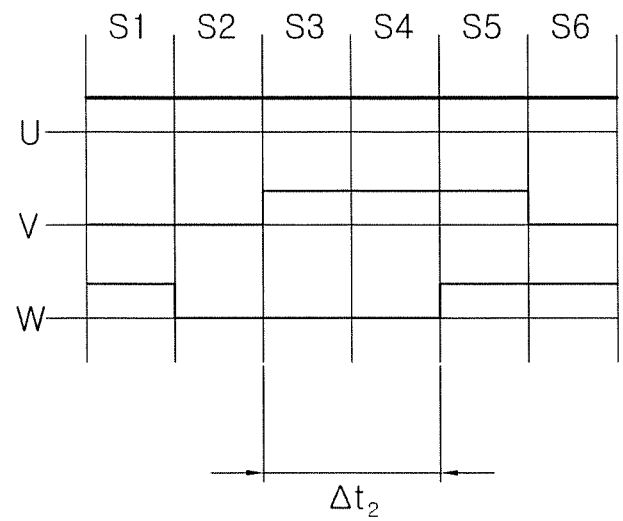
Figures 4A, 4B:
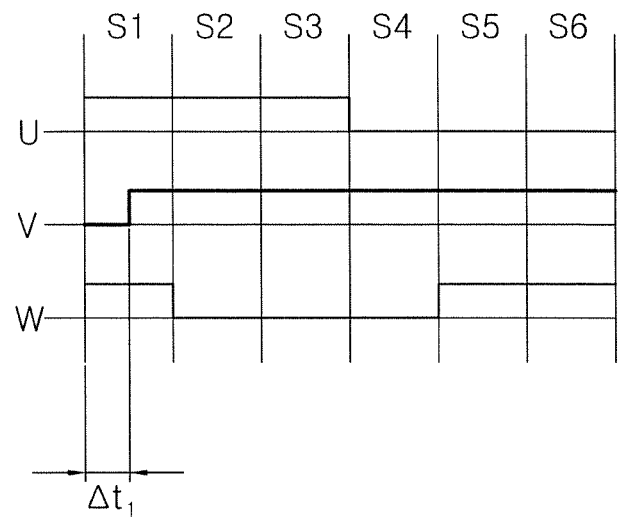
Figures 4C, 4D:
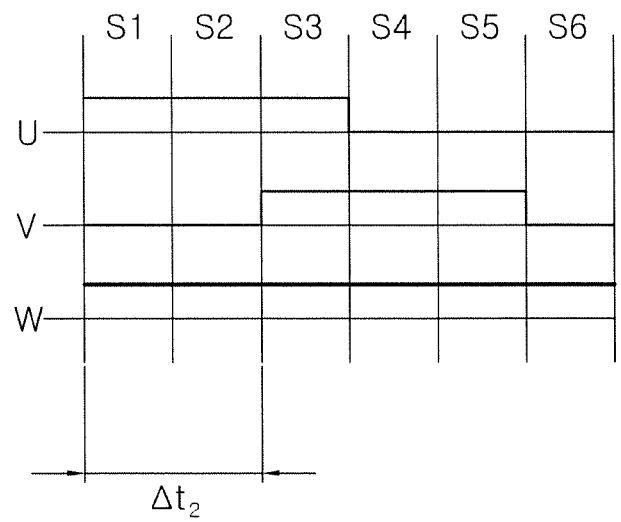
Figures 5A, 5B:
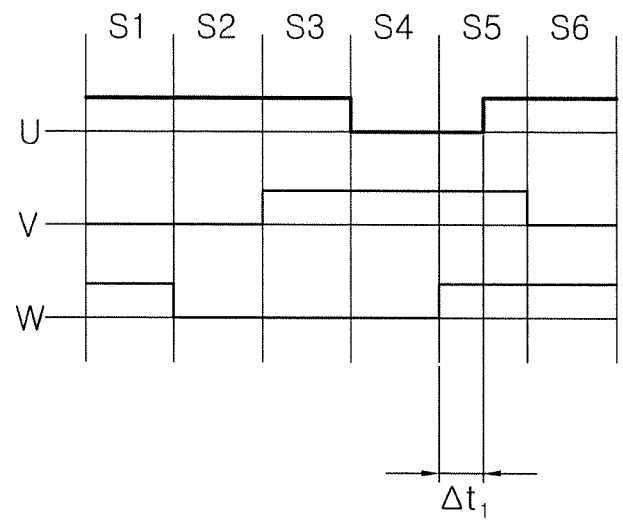
Figures 5C, 5D:
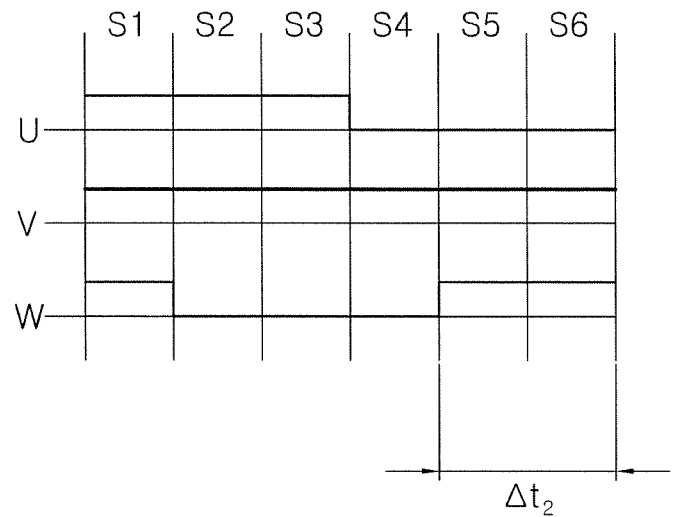
Figures 6A, 6B:
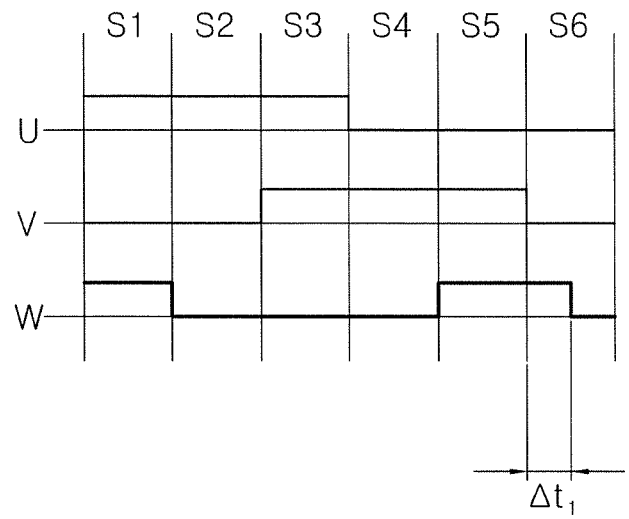
Figures 6C, 6D:
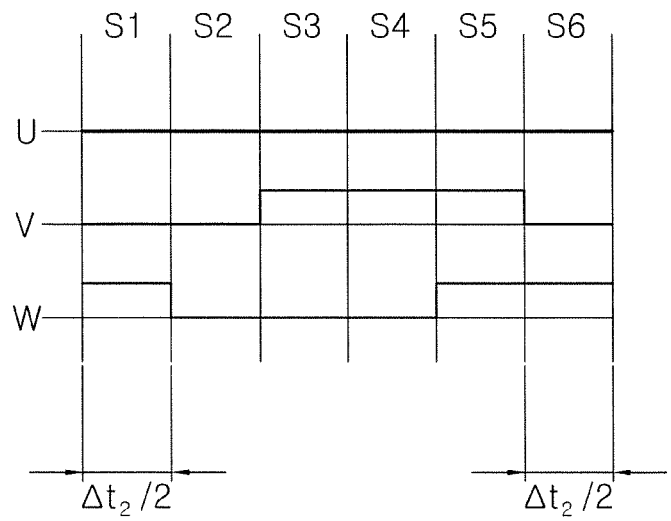
Figures 7A, 7B:
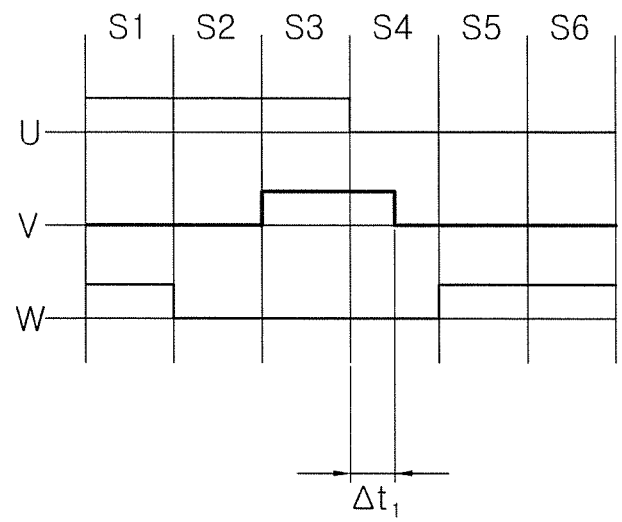
Figures 7C, 7D:
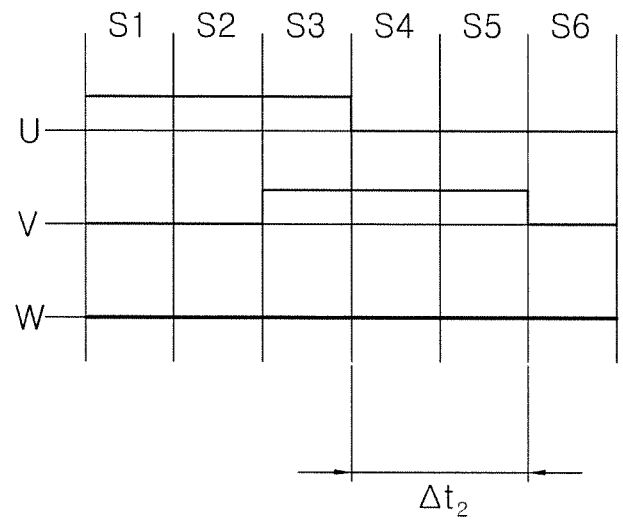
Figures 8A, 8B:
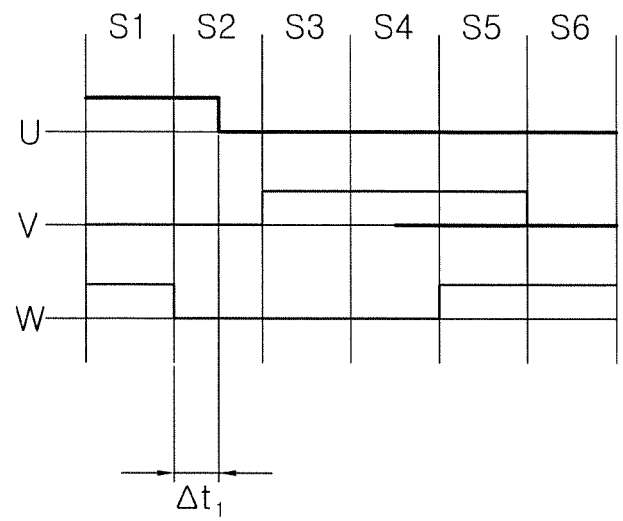
Figures 8C, 8D:
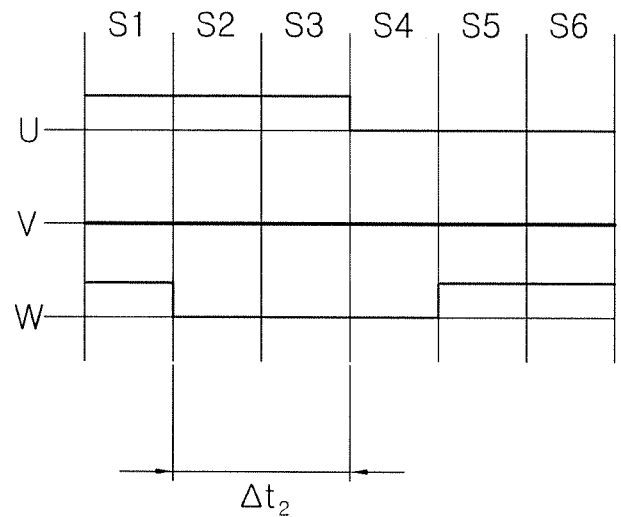

However, even when the W phase 35 outputs 1 due to the failure, 1, 1, and 0 may be output as the normal signal just before the failure signal. FIGS. 3A and 3B illustrate the case in which the W phase 35 is out of order in the middle of section S3. In FIGS. 3C and 3D, the same failure signal and normal signal are generated, as with the case in which the U phase 31 is out of order. Therefore, the failure of the W phase 35 and the failure of the U phase 31 are differentiated depending on the difference between the time at the start of generating a normal signal and the time at the start of generation of a failure signal to accurately diagnose the failure of the hall sensor 30 and output the virtual signal suitable therefore to prevent the motor 20 from stopping.

In detail, in the diagnosing (S130), when the normal signals are the output signals that the U phase 31 and the V phase 33 of the three phases of the hall sensor are 1 and the failure signals are the output signals that the three phases 31, 33, and 35 all are 1, if the difference is beyond the preset time, the U phase 31 is diagnosed as the failure. If the difference is less than the preset time, the W phase 35 is diagnosed as the failure.

The preset time may be set to be the time when one of the output signals output when the hall sensor 30 is in the normal condition is sustained. That is, sections of S1, S2, S3, S4, S5, and S6 illustrated in the graphs of FIGS. 3 to 8 may be set to be the time at which one output signal is sustained. Therefore, referring to FIGS. 3A to 3D, the control unit 40 may diagnose the failure of the W phase 35 when the time to output the normal signals of 1, 1, and 0 is $\Delta t1$ which is less than the preset time. On the contrary, if the time to output the normal signal is $\Delta t2$ which is beyond the preset time, the failure of the U phase 31 may be accurately diagnosed.

Further, during the diagnosing (S130), when the normal signals are the output signals that the U phase 31 and the W phase 35 of the three phases of the hall sensor are 1 and the failure signals are the output signals that the three phases 31, 33, and 35 all are 1, if the difference is beyond the preset time, the W phase 35 is diagnosed as the failure. If the difference is less than the preset time, the V phase 35 is diagnosed as the failure. Referring to FIGS. 4A to 4D, the control unit 40 may diagnose the failure of the V phase 33 when the time to output the normal signals of 1, 0, and 1 is $\Delta t1$ which is less than the preset time. On the contrary, if the time to output the normal signal is $\Delta t2$ which is beyond the preset time, the failure of the W phase 35 may be accurately diagnosed.

Further, when the normal signals are the output signals that the W phase 35 and the V phase 31 of the three phases of the hall sensor are 1 and the failure signals are the output signals that the three phases of the hall sensor all are 1, if the difference is beyond the preset time, the V phase 33 is diagnosed as the failure. If the difference is less than the preset time, the U phase 31 is diagnosed as the failure. Referring to FIGS. 5A to 5D, the control unit 40 may diagnose the failure of the U phase 31 when the time to output the normal signals of 0, 1, and 1 is $\Delta t1$ is less than the preset time. On the contrary, if the time to output the normal signal is $\Delta t2$ which is beyond the preset time, the failure of the V phase 33 may be accurately diagnosed.

Even when the broken phase of the three phases of the hall sensor 30 outputs 0 due to the failure, the control unit may accurately perform the failure diagnosis by the following method.

During the diagnosing (S130), when the normal signals are the output signals that only the W phase 35 of the three phases of the hall sensor are 1 and the failure signals are the output signals that the three phases 31, 33 and 35 all are 0, if the difference is beyond the preset time, the U phase 31 is diagnosed as the failure. If the difference is less than M the preset time, the W phase 35 is diagnosed as the failure. Referring to FIGS. 6A to 6D, the control unit 40 may diagnose the failure of the W phase 35 when the time to output the normal signals of 0, 0, and 1 is $\Delta t1$ which is less than the preset time. On the contrary, if the time to output the normal signal is $\Delta 2$ is beyond the preset time, the failure of the U phase 31 may be accurately diagnosed.

Further, in the diagnosing (S130), when the normal signal is the output signal that only the V phase 33 of the three phases of the hall sensor is 1 and the failure signal is the output signal that the three phases 31, 33, and 35 all are 0, if the difference is beyond the preset time, the W phase 35 is diagnosed as the failure. If the difference is less than the preset time, the V phase 33 is diagnosed as the failure. Referring to FIGS. 7A to 7D, the control unit 40 may diagnose the failure of the V phase 33 when the time to output the normal signals of 0, 1, and 0 is $\Delta t1$ which is less than the preset time. On the contrary, if the time to output the normal signal is $\Delta t2$ which is beyond the preset time, the failure of the W phase 35 may be accurately diagnosed.

In the diagnosing (S130), when the normal signal is the output signal that only the U phase 31 of the three phases of the hall sensor is 1 and the failure signal is the output signal that the three phases of the hall sensor all are 0, if the difference is beyond the preset time, the V phase 33 is diagnosed as the failure. If the difference is less than the preset time, the U phase 31 is diagnosed as the failure. Referring to FIGS. 8A to 8D, the control unit 40 may diagnose the failure of the U phase 31 when the time to output the normal signals of 1, 0, and 0 is $\Delta t1$ which is less than the preset time. On the contrary, if the time to output the normal signal is $\Delta t2$ which is beyond the preset time, the failure of the V phase 33 may be accurately diagnosed.

Therefore, when the failure signal is generated, it is possible to prevent the occurrence of the situation in which it may not be determined which of the three phases 31, 33, and 35 of the hall sensor is out of order.

In conclusion, the control unit 40 outputs the virtual signal for the phase which is diagnosed as the failure among the three phases of the hall sensor 30 to the motor controller 50 to prevent the motor 20 from stopping due to the failure of the hall sensor 30. Accordingly, it may be possible to ensure that the vehicle may be driven by preventing a stopping of the driving of the electrical oil pump 10. The virtual signals are the output signals in the normal condition corresponding to each phase of the hall sensor.

The method for controlling a motor having the above structure outputs the virtual signal to prevent the motor from stopping due to the failure of the hall sensor, such that it is possible to ensure the vehicle may be driven by preventing a stopping of the electric oil pump.

Further, the control unit detects the failure of the hall sensor to prevent the motor from stopping when the oil temperature of the electric oil pump is low or the motor rotates at a low RPM, thereby diagnosing the failure of the hall sensor.

Although the present disclosure has been shown and described with respect to specific exemplary embodiments, it will be obvious to those skilled in the art that the present disclosure may be variously modified and altered without departing from the spirit and scope of the present disclosure as defined by the following claims.

What is claimed is:

1. A method for controlling a motor, comprising steps of:
   detecting, by an electronic control unit (ECU), output signals from three phases of a hall sensor;
   determining, by the ECU, a failure of the hall sensor when a failure signal combination of the three phases, which corresponds to a failure state of the hall sensor, is received beyond a predetermined number of occurrences or periodically received for a predetermined time;
   diagnosing, by the ECU, which of the three phases of the hall sensor is out of order by comparing a time difference between a time at the start of generating the failure signal combination and a time at the start of generating a normal signal combination, which corresponds to a normal state of the hall sensor just before the failure signal combination is received, with a preset time;
   outputting, by the ECU, a virtual signal for the phase which is determined as a failure among the three phases of the hall sensor to a motor controller to prevent the motor from stopping due to the failure of the hall sensor
   wherein, in the step of diagnosing,
   the three phases of the hall sensor have first phase, second phase, and third phase in numerical order,
   when having a normal signal combination in which the first and second phases have 1 and having a failure signal combination in which the three phases are all 1, the first phase is determined to be out of order if the time difference is beyond the preset time and the third phase is determined to be out of order if the time difference is less than the preset time, and
   when having a normal signal combination in which only the third phase among the three phases has 1 and having a failure signal combination in which the three phases are all 0, the first phase is determined to be out of order if the time difference is beyond the preset time and the third phase is determined to be out of order if the time difference is less than the preset time.

2. The method of claim 1, wherein in the step of diagnosing, when normal signals are output signals that U phase and V phase of the three phases of the hall sensor are 1 and the failure signals are output signals that the three phases all are 1, if the difference is beyond the preset time, the U phase is diagnosed as the failure and if the difference is less than the preset time, W phase is diagnosed as the failure.

3. The method of claim 1, wherein in the step of diagnosing, when normal signals are output signals that U phase and W phase of the three phases of the hall sensor are 1 and the failure signals are output signals that the three phases all of the hall sensor are 1, if the difference is beyond the preset time, the W phase is diagnosed as the failure and if the difference is less than the preset time, V phase is diagnosed as the failure.

4. The method of claim 1, wherein in the step of diagnosing, when normal signals are output signals that V phase and W phase of the three phases of the hall sensor are 1 and the failure signals are output signals that the three phases all of the hall sensor are 1, if the difference is beyond the preset time, the V phase is diagnosed as the failure and if the difference is less than the preset time, U phase is diagnosed as the failure.

5. The method of claim 1, in the step of diagnosing, when normal signals are output signals that only W phase of the three phases of the hall sensor are 1 and the failure signals are output signals that the three phases all are 0, if the difference is beyond the preset time, U phase is diagnosed as the failure and if the difference is less than the preset time, the W phase is diagnosed as the failure.

6. The method of claim 1, wherein in the step of diagnosing, when normal signals are output signals that only V phase of the three phases of the hall sensor is 1 and the failure signals are output signals that the three phases all of the hall sensor are 0, if the difference is beyond the preset time, W phase is diagnosed as the failure and if the difference is less than the preset time, the V phase is diagnosed as the failure.

7. The method of claim 1, wherein in the step of diagnosing, when normal signals are output signals that only U phase of the three phases of the hall sensor is 1 and the failure signals are output signals that the three phases of the hall sensor all are 0, if the difference is beyond the preset time, V phase is diagnosed as the failure and if the difference is less than the preset time, the U phase is diagnosed as the failure.

8. The method of claim 1, wherein the failure signal combination of the three phases is a combination of output signals where the three phases are all 0 or 1.

* * * * *